April 25, 1967 G. VON BERNUTH ETAL 3,316,465
MULTI-LAYER JUNCTION SEMICONDUCTOR DEVICES SUCH AS CONTROLLED RECTIFIERS AND TRANSISTORS, CONTAINING ELECTROPOSITIVE PROTECTIVE COATING
Original Filed March 29, 1962 2 Sheets-Sheet 1

3,316,465

MULTI-LAYER JUNCTION SEMICONDUCTOR DEVICES SUCH AS CONTROLLED RECTIFIERS AND TRANSISTORS, CONTAINING ELECTROPOSITIVE PROTECTIVE COATING

Gotz von Bernuth, Ottomar Jantsch, and Dieter Krockow, all of Munich, Germany, assignors to Siemens-Schuckertwerke Aktiengesellschaft, Berlin and Erlangen, Germany, a corporation of Germany Continuation of application Ser. No. 183,531, Mar. 29, 1962. This application Mar. 18, 1966, Ser. No. 535,611
Claims priority, application Germany, Mar. 29, 1961, S 73,228
3 Claims. (Cl. 317—234)

This application is a continuation of Ser. No. 183,531, filed Mar. 29, 1962, now abandoned.

Our invention relates to multi-layer semiconductor devices of the junction type, such as controlled rectifiers or transistors having a high-ohmic semiconductor body fundamentally of n-type electric conductance, for example of germanium, silicon or an intermetallic semiconductor compound such as an $A_{III}B_V$ compound, and having an n-type region of the semiconductor body which forms respective p-n junctions with two regions of p-type conductance produced in the semiconductor body, the semiconductor body having an n-type conductance zone exposed at the surface between the two p-n junctions.

In the manufacture of such semiconductor devices, for example silicon-controlled rectifiers and other four-layer junctions devices, some of them are often found to have unsatisfactory properties or to exhibit an instable electric characteristic due to the occurrence of conducting channels between the p-n junctions; and it is an object of our invention to eliminate such deficiencies by reliably preventing channel formation.

Figure 5:
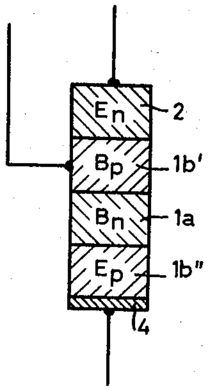
Figure 3:
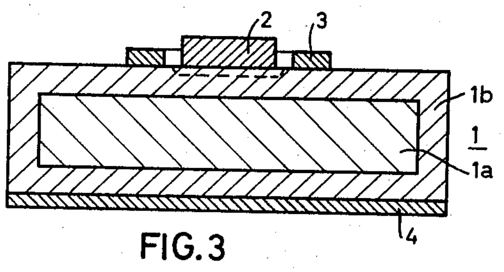
Figure 6:
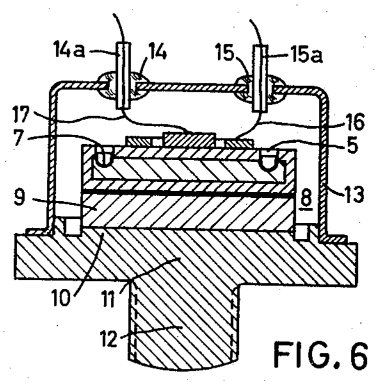
Figure 7:
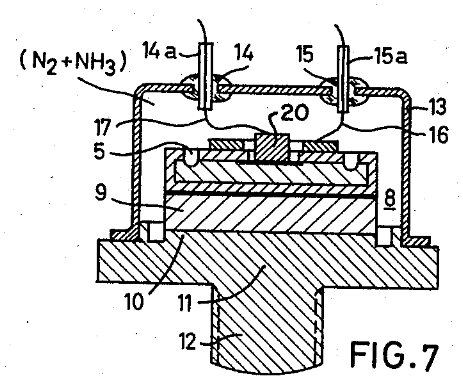
Figure 8:
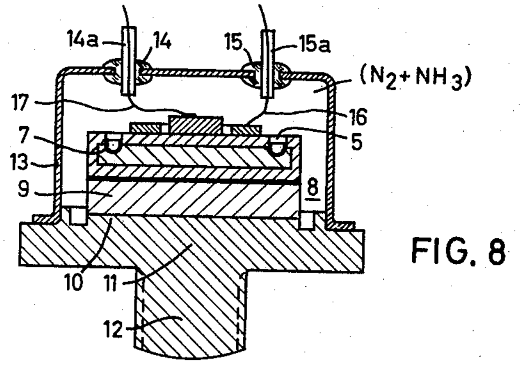
Figures 9, 10:
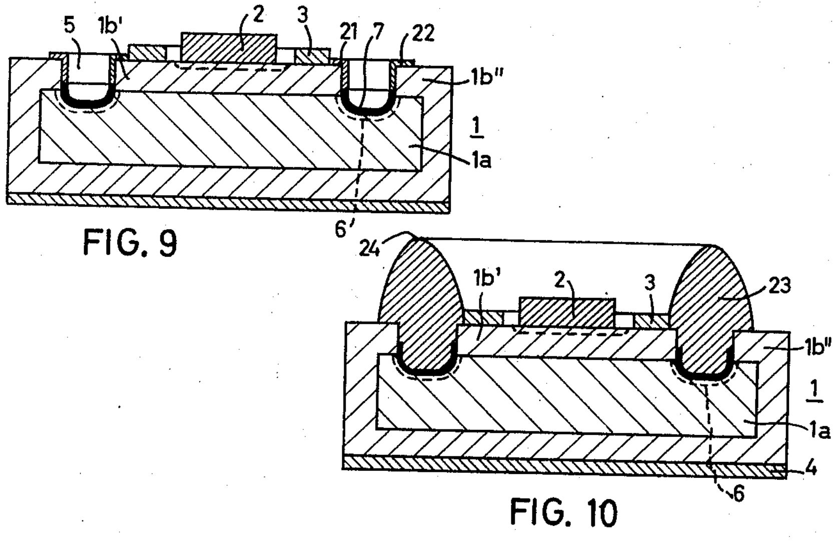

The invention will be described with reference to the drawing in which in FIGS. 1, 2, 3 and 4 is shown a silicon-controlled rectifier in four successive stages of production. FIG. 5 shows a schematic diagram relating to the same rectifier, FIGS. 6 to 8 are sectional views of complete encapsulated devices according to the invention, and FIGS. 9 and 10 show in section two further devices according to the invention.

Figure 1:
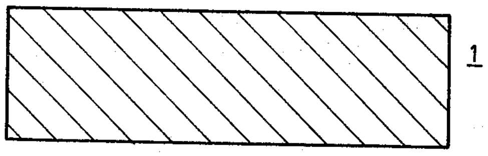

The semiconductor body 1 according to FIG. 1 consists, for example, of silicon doped for n-type conductance and is shaped as a circular disc of rectangular cross section.

Figure 2:
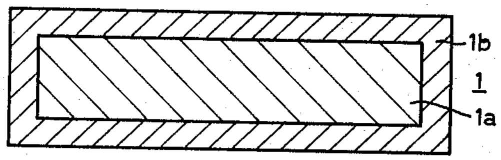

FIG. 2 shows the same semiconductor body after impurity atoms, for example aluminum, have been diffused into the body from all sides so that the body 1 now has a core region 1*a* of n-type conductance and a jacket region 1*b* of p-type conductance. The top surface of the semiconductor body is then provided with two electrodes, 2 and 3 according to FIG. 3. Another electrode 4 is attached to its bottom surface. The three electrodes are joined with the semiconductor body by an alloying process. The electrodes 3 and 4 consist of metallic material that has doping action with respect to the semiconductor substance, or of an electrode material that contains a suitable doping addition. The doping substance in each case is so chosen, relative to the conductance type of the adjacent semiconductor region, that there occurs an ohmic junction between the alloyed region of the ring-shaped electrode 3 and the p-type jacket zone 1*b* and another ohmic junction between the alloyed zone of the electrode 4 and the jacket zone 1*b*. That is, the materials of electrodes 3 and 4 have acceptor (p-type) action or, in any event, no type-changing doping action upon the adjacent semiconductor region 1*b*. For example, suitable as material for electrodes 3 and 4 is gold or a gold alloy with an addition of 0.001 to 2% boron. The material of the electrode 2, however, is so chosen that its doping action produces n-type conductance. Hence, a p-n junction is produced between the alloyed front of the electrode 2 and the p-type jacket region 1*b*. The electrode 2 may consist, for example, of a gold alloy with an addition of antimony.

Figure 4:
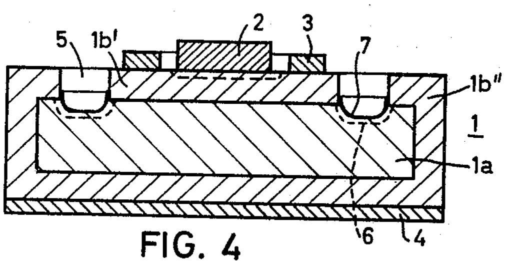

The semiconductor body 1, thus equipped with electrodes, is now provided with a groove 5 according to FIG. 4. The groove, which can be produced, for example, by an etching process, extends from the upper surface of the p-type jacket region 1*b* of semiconductor body 1 down into the n-type core region 1*a*. Due to the presence of the groove 5 which extends around the ring-shaped electrode 3, there occur two separate zones 1*b'* and 1*b''* in the original p-type jacket region 1*b*. In the ultimate condition therefore, the device constitutes a switching rectifier (silicon-controlled rectifier) of the type schematically represented by the diagram of FIG. 5. The device constitutes a four-layer system with alternating n-type and p-type layers which in FIG. 5 are identified by the same reference characters as in FIG. 4.

A semiconductor switching device designed in this manner can be enclosed in a gas-tight capsule which is either evacuated or filled with protective gas. Such a device, corresponding to the scheme of FIG. 5, possesses several p-n junctions. It is important, as is the case with any semiconductor device possessing a p-n junction, that each of the p-n junctions in the multi-layer device exhibit the desired reliable high blocking action and also has the required stability of the blocking action. It has been found, however, that the behavior of the p-n junctions relative to their blocking ability in such multi-layer devices is not always sufficiently stable during the intended operation of such devices; and the present invention is predicated upon the concept that such irregular deficiencies are caused by channel formation across the p-n junctions. That is, at the bottom of the groove 5 and consequently at the exposed and bare surface of the semiconductor region 1*a* of n-type conductance there may occur electric charges which cause influenced or induced electric charges of p-character to appear on the immediately adjacent surface areas of the semiconductor body. Such p-type charges may form a conductive channel as schematically represented at 6 across zones 1*b'* and 1*b''* of the p-type core region 1*b*, thus electrically bridging or shorting the p-n junction.

Based on these considerations and in accordance with our invention, we have found that the erratic or instable behavior of the p-n junctions is eliminated by subjecting the surface zone of the n-type semiconductor body between the p-n junctions to the effect of a substance which, upon being deposited upon this zone, has electropositive action and possesses such a low vapor pressure as to cause, by electric-field influence, a negative charge to occur in the immediately adjacent n-type body surface areas of the semiconductor. These induced negative charges then prevent the formation of conductive channels between the p-n junctions. The deposition of the electropositive substance can be effected, for example, in form of a coating or layer consisting of a varnish with an admixture of substance that has the desired electropositive action after deposition. Suitable as such an addition is alizarin which may be used in quantity of about 1 to 20% by weight of the varnish. The varnish itself may consist of any insulating varnish used for insulating or protective purposes on electrical semiconductor devices. Suitable, for example, is a silicone varnish. Preferably employed is a silicone-modified terephthal ester resin which can be used with or without an admixture of alizarin or other addition of electropositive substance. Terephthal ester resin, apparently, acts in itself electropositively after being deposited upon the surface zone of the n-type semiconductor body and, besides, is temperature resistant in its change-inducing behavior at low temperatures, for example of minus 60° C. as well as at high temperatures up to about plus 240° C.

A suitable composition of silicone resin and terephthal ester resin is the following mixture:

40% by weight of phenyl-methyl-polysiloxane resin and 10% by weight terephthal ester resin are dissolved in 50% by weight of cyclohexanone, namely an aliphatic ketone. The terephthal ester resin may be an ester of terephthalic acid and an aliphatic glycol, such as ethylene-glycol, propylene-glycol or butylene-glycol. This composition is available in the trade from Wacker, Munich, Germany, under the trade designation "CL1."

Another suitable varnish is a composition of silicone resin and a phenolic resin, each in a mixture of organic solvents. As solvent mixture in the former case, cyclohexanone with toluol may be used for example. In the latter, xylol with cyclohexanone may be used.

The following composition of silicone resin and phenyl resin can be used:

39% by weight phenyl-methyl-polysiloxane resin and 21% by weight phenol-formaldehyde resin, dissolved in 40% by weight of xylol. This composition is available in the trade from Wacker, Munich, Germany, under the designation "CL6."

The resins are typical comparatively low molecular weight varnish resins, and are of sufficiently high molecular weight so as to have no appreciable vapor pressure at 20° C. The silicone resin is of a commercially available type, and is sold by Dow-Corning under the trade name DC801.

To each of these compositions, can then be added the above-mentioned addition substance, for example, alizarin, which when the coating is placed upon the p-n surface area and the vicinity thereof, becomes electropositively active, and due to its low vaporization temperature has sufficient stability during manufacture of the semiconductor device and its subsequent operation. The production of a semiconductor device according to the invention, in the manner just described, may proceed as follows. First, the semiconductor element, including its p-n junction is completed. The groove 5 of FIG. 4 is then coated with a coating 7 of one of the above-mentioned combination substances. This is done by brushing the resinous substance onto the surface or spraying it thereupon. This substance is then cured by heat-treatment at about 200° C. for a period of about 10 to 15 hours, whereby it becomes hardened.

The presence of the electropositive coating causes negative charges to occur on the immediately adjacent surface zone of the region 1_a_ and thus prevents the occurrence of positive charges which otherwise may electrically interconnect the regions 1_b'_ and 1_b''_ and thus electrically bridge the p-n junctions 1_b'_–1_a_ and 1_b''_–1_a_.

In addition to or in place of alizarin (melts at 290° C.), we can employ purpurin (melts at 256° C.), or tetrahydroxy-quinone (melts at 312–318° C. with decomposition), theobromine, barbituric acid, or fluorescein which is resorcinolphthalein having two phenolic hydroxy groups. Alizarin is employed in the coating composition preferably in a ratio equal to 20% by weight. The others are likewise preferably employed in a ratio of the same order of magnitude.

Instead of employing the above-described coating it is sufficient in some cases to provide the encapsulation for the semiconductor element with a substance that has an electropositive effect on the surface of the semiconductor, this being the case for example with ammonia. Furthermore, such an additional substance, for example aqueous or gaseous or vaporous ammonia, can also be used in conjunction with a coating that cointains alizarin or other electropositive substance. An alizarin-containing varnish has a most favorable effect at relatively high temperatures but does not have the same good quality at temperatures in about the order of normal room temperature. However, the desired stability of the p-n junctions, by prevention of channel formation, can be secured for all operating temperatures of interest, if the above-mentioned combination is taken advantage of; namely by using a varnish coating and also filling the housing or capsule of the semiconductor device with ammonia. The ammonia induces negative charges in the adjacent surface zone of the semiconductor body, particularly at the lower temperatures, such as normal room temperature, whereas the varnish coating reliably secures the corresponding effect at the higher operating temperatures.

FIGS. 6, 7 and 8 show such encapsulated devices. Each comprises a semiconductor element, denoted as a whole by 8. In the embodiment of FIGS. 6 and 8, the element 8 is designed in accordance with the one described above with reference to FIG. 4. The element, having a semiconductor body of silicon, is provided with an auxiliary carrier plate 9 of molybdenum, tungsten, tantalum, chromium or an alloy thereof which is soldered or alloyed together with the bottom electrode. The carrier plate 9 is fastened, for example by hard soldering, on the top portion 10 of a base 11 of copper which serves as a heat sink and is integral with a screw bolt 12. Fastened to the base plate 11 is the flange of a bell-shaped cover 13 which is attached and sealed, for example by electric resistance welding. Tubular insulating sleeves 14_a_ and 15_a_ are joined with the cover by fused seals 14 and 15 respectively and are traversed by electric leads 17 and 16 attached to the respective electrodes 2 and 3 of the semiconductor element. The sleeves 14_a_, 15_a_ can be employed for evacuating, rinsing and filling the interior of the capsule. Thereafter an ultimate gas-tight sealing of the capsule is obtained by squeezing the sleeves together at localities outside of the respective fused seals 14 and 15, if desired together with a simultaneous or subsequent welding or soldering operation.

According to FIG. 6, an electropositive varnish is deposited as a coating 7 upon the bottom of the etched groove 5 as explained above with reference to FIG. 4.

According to FIG. 7, the interior of the capsule, after evacuation, is filled with nitrogen ($N_2$) and added ammonia ($NH_3$).

According to FIG. 8, the bottom of the groove 5 is coated with electropositively acting varnish and the interior of the encapsulation is provided with a gaseous atmosphere that contains nitrogen ($N_2$) and an addition of ammonia ($NH_3$).

The invention is analogously applicable for area-type (junction-type) transistors. For example, if a semiconductor device according to FIG. 4 is modified by eliminating the electrode 2 and providing the n-type semiconductor body 1_a_ with an electrode 20, as shown in FIG. 7, the electrode 3 together with region 1_b'_ constitutes the emitter, the region 1_a_ with electrode 20 constitutes the base, and the electrode 4 together with region 1_b''_ constitutes the collector of a p-n-p transistor having an exposed n-type surface zone of portion 1_a_ located between the two p-type regions 1_b'_ and 1_b''_. The electrode 20 forms an ohmic contact with region 1_a_ and may be joined therewith by alloying. Instead of enveloping the n-type region 1_a_ completely by a p-type region 1_b_ according to FIG. 2 by diffusion and thereafter removing the upper central portion of region 1_b_ for then contacting the ohmic base electrode 20 with region 1_a_, this surface portion of the original body 1 (FIG. 1) may also be masked off during diffusion so that no subsequent machining is necessary before joining the electrode 20 with the semiconductor body. Regardless of the manufacturing method, the method according to the invention is applicable to transistors in the same manner as described above with reference to a controlled rectifier.

The improvement achieved by virtue of the invention is illustrated by the following test results. Encapsulated silicon-controlled rectifiers of the type described above were coated in the above-mentioned groove with an electrically neutral silicone varnish. When current of about 10 milliamp (ma.) was passed in the reverse direction of the rectifier through the path between the main electrodes, a peak inverse blocking voltage of about 280 volts was measured between these electrodes.

However, with a silicon-controlled rectifier of the same design but provided on the groove bottom with an electropositive coating as described above, namely a silicone-modified terephthal ester resin with an alizarin addition of 20% by weight, the same reverse current of about 10 ma. resulted in a peak inverse blocking voltage of about 600 volts. This indicates a considerable improvement in blocking ability of the device.

The tests in each case were made at about 120° C. steady-state temperature of the semiconductor device.

Further tests were made with a silicon-controlled rectified gas-tightly encapsulated and coated on the groove bottom with an electrically neutral varnish. With an inverse current of 10 ma. a blocking voltage of about 20 volts was measured. Ammonia was then introduced into the capsule of the same device. This was done by immersing a piece of silver wire about 5 mm. deep into aqueous ammonia and then inserting the wetted end through a bore into the capsule, thereafter soldering and gas-tightly sealing the wire in the bore. This apparently resulted in enriching the atmosphere in the capsule with ammonia vapor. The measuring operations were then repeated at an ambient temperature of about 120° C. An inverse current of about 10 ma. now resulted in a blocking voltage of approximately 240 volts.

At an ambient temperature of 20° C., a current of 10 ma. without ammonia addition resulted in a blocking voltage of about 400 volts. With ammonia addition, however, a blocking voltage of about 500 volts was measured.

While, as described above, the coating of electropositive action is located on the bottom of the groove 5 and, according to FIG. 4, covers essentially only the p-n junctions between the respective zones 1*b*″–1*a* and 1*b*′ and 1*a* as well as the intermediate surface zone of the core region 1*a*, such electropositive coating may also cover the entire wall of the groove 5 and, if desired, may also extend over the marginal areas on the surface zones of regions 1*b* and 1*b*″ surrounded by the groove or located around the groove. That is, the coating may also cover the surface zones of the semiconductor body adjacent to the groove. However, the protective coating of insulating material need not necessarily have electropositive action at those localities that are beyond the two p-n junctions.

The provision of an insulating coating, in addition to the electropositive coating at the groove bottom between the p-n junctions has the advantage of minimizing or virtually obviating the danger of gas discharges and creeping discharges occurring at the semiconductor surface in the event of high voltage differences between the electrodes. Such prevention of undesired discharges is due to the fact that the electric field strength at the boundary surface between the gas space and the semiconductor body is reduced by the additionally provided insulating coating, as compared with the field-strength value existing under the same conditions when only the electropositive coating 7 on the groove bottom is employed. The advantage of the extended coating just described therefore is to reduce the tendency toward gas discharges or creeping discharges along the semiconductor surface between the electrodes 3 and 4.

Instead of providing a supplemental coating that extends the electropositive coating 7 according to FIG. 4 on the surface of the groove and over the surface portions of the semiconductor body adjacent to the groove, a similar improvement with respect to prevention of gas discharges and creeping discharges can be obtained by filling the groove with an insulating material which forms above the groove a bulge of sufficient dimensions to prolong the discharge distance between the electrodes. This has the advantageous result that the length of the zone between the edges of the electropositive coating of insulating material is not limited by the depth of the groove.

The embodiments of semiconductor devices according to the invention shown in FIGS. 9 and 10 are of the just mentioned type. Both comprise a semiconductor device fundamentally corresponding to that described above with reference to FIG. 4, this being apparent from coincident reference characters respectively. According to FIG. 9, the electropositive varnish coating 7 is supplemented by two further coatings 21 and 22 of insulating material which cover the groove wall and extend also over portions of the surfaces on regions 1*b*′ and 1*b*″ adjacent to the respective edges of the groove.

In the embodiment according to FIG. 10, the additional coatings 21 and 22 are substituted by a filler body 23 of insulating material which covers the coating 7 as well as those wall portions of the groove 5 that are not covered by the coating 7. The insulating body 23 also extends upwardly beyond the plane determined by the top surface of the semiconductor body and forms an annular hill or mound structure of rounded shape, thus extending the gas-discharge or creeping distance between the electrodes 3 and 4.

The insulating material 23 may consist of resinous plastic, which can be filled into the groove and given the desired shape before being converted to solid shape by thermal treatment or a polymerization process.

We claim:

1. A multi-layer semiconductor device, comprising a semiconductor body having a region of n-type conductance and two p-type regions forming two respective p-n junctions with said n-type zone, said n-type region having an n-type surface zone between said two junctions, an electropositive coating on said surface zone, a housing gas-tightly enclosing said body and containing ammonia in contact with said body at said zone and contact means from said n-type and p-type regions to outside said enclosure.

2. A multi-layer semiconductor device, comprising a semiconductor body having a region of n-type conductance and two p-type conductance regions forming two respective p-n junctions with said n-type zone, said n-type region having an n-type surface zone between said two junctions and an electropositive varnish coating on said surface zone between said two junctions and an insulating coating over said varnish coating and extending to the adjacent portions of said p-type conductance regions.

3. A multi-layer semiconductor device, comprising a semiconductor body having a region of n-type conductance and two p-type conductance regions forming two respective p-n junctions with said n-type zone, said n-type region having an n-type surface zone between said two junctions and an electropositive varnish coating on said surface zone between said two junctions and a mound-shaped insulating resinous plastic coating over said varnish coating and the adjacent p-type conductance regions.

References Cited by the Examiner

UNITED STATES PATENTS 3,145,328 8/1964 Letaw et al. ---------- 317—234

JOHN W. HUCKERT, *Primary Examiner.*

R. F. POLISSACK, *Assistant Examiner.*